(12) United States Patent
Tonkin

(10) Patent No.: US 11,881,908 B1
(45) Date of Patent: Jan. 23, 2024

(54) INTAKE AIR HEATING SYSTEMS AND METHODS

(71) Applicant: Phillips & Temro Industries Inc., Eden Prairie, MN (US)

(72) Inventor: Steven W. Tonkin, Eden Prairie, MN (US)

(73) Assignee: Phillips & Temro Industries Inc., Eden Prairie, MN (US)

(*) Notice: Subject to any disclaimer, the term of this patent is extended or adjusted under 35 U.S.C. 154(b) by 0 days.

(21) Appl. No.: 17/967,162

(22) Filed: Oct. 17, 2022

(51) Int. Cl.
| | |
|---|---|
| *H04B 3/54* | (2006.01) |
| *F02M 31/13* | (2006.01) |
| *G01R 27/16* | (2006.01) |
| *F24H 15/25* | (2022.01) |
| *G05D 23/19* | (2006.01) |
| *G05D 23/24* | (2006.01) |
| *F02D 41/24* | (2006.01) |
| *F02D 41/28* | (2006.01) |

(52) U.S. Cl.
CPC .......... *H04B 3/548* (2013.01); *F02D 41/2422* (2013.01); *F02M 31/13* (2013.01); *F24H 15/25* (2022.01); *G01R 27/16* (2013.01); *G05D 23/1917* (2013.01); *G05D 23/2401* (2013.01); *H04B 3/542* (2013.01); *F02D 2041/285* (2013.01); *H04B 2203/547* (2013.01); *H04B 2203/5408* (2013.01); *H04B 2203/5445* (2013.01)

(58) Field of Classification Search
CPC .......... F02D 41/2422; F02D 2041/285; F02M 31/13; F24H 15/25; G01R 27/16; G05D 23/1917; G05D 23/2401; H04B 3/54; H04B 3/542; H04B 3/544; H04B 3/548; H04B 2203/00; H04B 2203/54; H04B 2203/5404–5408; H04B 2203/5416; H04B 2203/5429; H04B 2203/5445; H04B 2203/547
See application file for complete search history.

(56) References Cited

U.S. PATENT DOCUMENTS 10,077,745 B2   9/2018   Tonkin et al.

FOREIGN PATENT DOCUMENTS

JP           H0736953 B2 *  4/1995

* cited by examiner

*Primary Examiner* — Hung Q Nguyen
*Assistant Examiner* — Mark L. Greene
(74) *Attorney, Agent, or Firm* — Harness, Dickey & Pierce, P.L.C.

(57) ABSTRACT

An intake air heating system for a vehicle includes: an air heater configured to heat air an intake system of an engine; an air heater control module configured to selectively apply power to the air heater via a power conductor; and a voltage sensor and communication module configured to: measure a voltage on terminals of the air heater; and transmit an indicator of the voltage to the air heater control module on the power conductor, where the air heater control module is further configured to: receive the indicator via the power conductor; determine a resistance of the air heater based on the voltage on the terminals of the air heater and a current through the air heater; and apply power to the air heater based on the resistance of the air heater.

20 Claims, 6 Drawing Sheets

INTAKE AIR HEATING SYSTEMS AND METHODS

FIELD

The present disclosure relates to intake air heating systems in internal combustion engines and more particularly to electronic control of intake air heating systems.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

An air-fuel mixture for an internal combustion engine is harder to ignite when cold, leading to less complete combustion and increased emissions. Once the engine has warmed up, the cylinders may warm the air-fuel mixture sufficiently. However, at startup, the engine may have no heat to contribute to the air-fuel mixture. Cold start conditions are especially severe when the ambient air temperature is low. An intake air heating system may be used to heat air arriving at the engine. This system may be located within or prior to the intake manifold. The intake air heating system may be brought up to temperature prior to attempting to start the engine.

Heating the intake air may allow for easier ignition and may hold the fuel in suspension more effectively, leading to fewer fuel droplets falling out of suspension in the air. Intake air heating systems may allow for faster starts of the engine, may reduce startup emissions (sometimes evidenced as "white smoke"), reduce engine wear, reduce overall battery consumption during startup, and reduce startup fuel consumption.

In FIG. 1, a not-to-scale illustration of a truck 100 includes an engine 104 and an air heater 108. While not shown, the intake manifold for the engine 104 may contain the air heater 108. In other words, the air heater 108 may be disposed within the intake system (e.g., the intake manifold). Based on a control signal from an engine control module 112, an air heater control module 116 electrically connects a battery 120 to the air heater 108.

For example, the air heater control module 116 may include an electromechanical relay. The air heater control module 116 may also include a timer so that the air heater 108 does not reach an over-temperature condition. However, if the engine 104 is started from a warm condition, where the air heater 108 is not cold but warm, this time-out may be too long, and the air heater 108 may experience an over-temperature condition. This may increase wear on the air heater 108 or may damage the air heater 108.

SUMMARY

In a feature, an intake air heating system for a vehicle includes: an air heater configured to heat air an intake system of an engine; an air heater control module configured to selectively apply power to the air heater via a power conductor; and a voltage sensor and communication module configured to: measure a voltage on terminals of the air heater; and transmit an indicator of the voltage to the air heater control module on the power conductor, where the air heater control module is further configured to: receive the indicator via the power conductor; determine a resistance of the air heater based on the voltage on the terminals of the air heater and a current through the air heater; and apply power to the air heater based on the resistance of the air heater.

In further features, the air heater control module is configured to determine the resistance of the air heater using one of an equation and a lookup table, the one of the equation and the lookup table relating currents and voltages to resistances.

In further features, the voltage sensor and communication module is configured to transmit the indicator of the voltage on the power conductor using a power line communication protocol.

In further features, the voltage sensor and communication module includes a microprocessor that is powered via the power conductor.

In further features, the voltage sensor and communication module is configured to set the indicator by encoding a digital value corresponding to the voltage.

In further features, the air heater control module is further configured to determine the voltage on the terminals of the air heater by decoding the indicator.

In further features, the voltage sensor and communication module is further configured to transmit an error correction parameter with the indicator to the air heater control module via the power conductor.

In further features, the air heater control module is further configured to verify correctness of the indicator based on the error correction parameter.

In further features, the air heater control module is configured to control the application of power to the air heater based on adjusting the resistance of the air heater within a predetermined resistance range.

In further features, the air heater control module is configured to apply power to the air heater using pulse width modulation (PWM) control and to determine a duty cycle for the PWM control based on the resistance.

In further features, the air heater control module is further configured to: determine a temperature of the air heater based on the resistance; and apply power to the air heater based on the temperature of the air heater.

In further features, the air heater control module is configured to measure the current to the current through the air heater.

In a feature, an intake air heating method for a vehicle includes: selectively applying power to an air heater via a power conductor, the air heater configured to heat air an intake system of an engine when powered; measuring a voltage on terminals of the air heater; and transmitting an indicator of the voltage to on the power conductor; receiving the indicator via the power conductor; determining a resistance of the air heater based on the voltage on the terminals of the air heater and a current through the air heater; and applying power to the air heater based on the resistance of the air heater.

In further features, determining the resistance includes determining the resistance of the air heater using one of an equation and a lookup table, the one of the equation and the lookup table relating currents and voltages to resistances.

In further features, transmitting the indicator includes transmitting the indicator of the voltage on the power conductor using a power line communication protocol.

In further features, transmitting the indicator includes transmitting the indicator by a voltage sensor and communication module that includes a microprocessor that is powered via the power conductor.

In further features, the method further includes setting the indicator by encoding a digital value corresponding to the voltage.

In further features, the method further includes determining the voltage on the terminals of the air heater by decoding the indicator.

In further features, the method further includes transmitting an error correction parameter with the indicator via the power conductor.

In further features, the method further includes verifying correctness of the indicator based on the error correction parameter.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

An intake air heater may be used to heat air flowing into an engine. An air heater control module controls application of power to the air heater via a power conductor based on achieving a target temperature, such as a target temperature for achieving target combustion conditions within the engine.

According to the present application, the air heater control module measures current flow to the air heater. A voltage sensor and communication module measures voltage on terminals of the air heater. The voltage sensor and communication module transmits the measured voltage on the terminals of the air heater to the air heater control module via the conductor used to power the air heater using power line communication. The air heater control module determines a resistance of the air heater based on the voltage on the terminals of the air heater and current to the air heater. The air heater control module controls the application of power to the air heater based on the resistance of the air heater, such as to maintain the resistance of the air heater within a predetermined resistance range. Measuring the voltage on the terminals of the air heater provides more accurate voltage measurements and therefore resistance estimates than measuring the voltage in other places, such as an output of the air heater control module.

Figure 2:
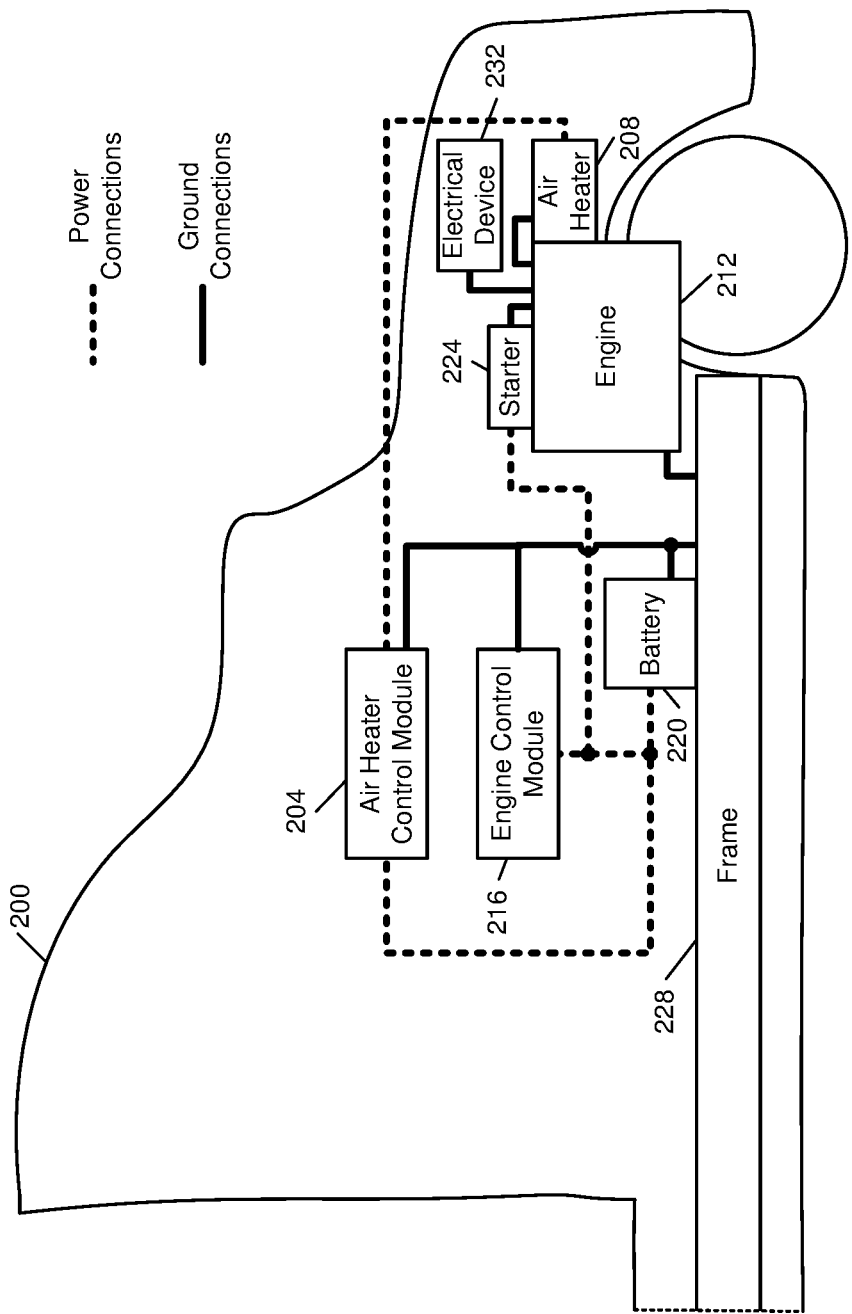
FIG. 2 is a functional block diagram of an engine with an intake air heating system showing selected power and ground connections.

FIG. 2 shows selected ground and power connections in a vehicle 200 configured with an air heater control module 204 and an air heater 208. The air heater 208 selectively heats air flowing into an engine 212. The air heater 208 is disposed within an (air) intake system of the engine 212, such as within an intake manifold. Air flows through the air heater 208 before flowing into the engine 212. The air heater control module 204 may be activated by engine control module 216. The air heater control module 204 provides current to the air heater 208 from a battery 220 to warm the air flowing into the engine 212.

Figure 1:
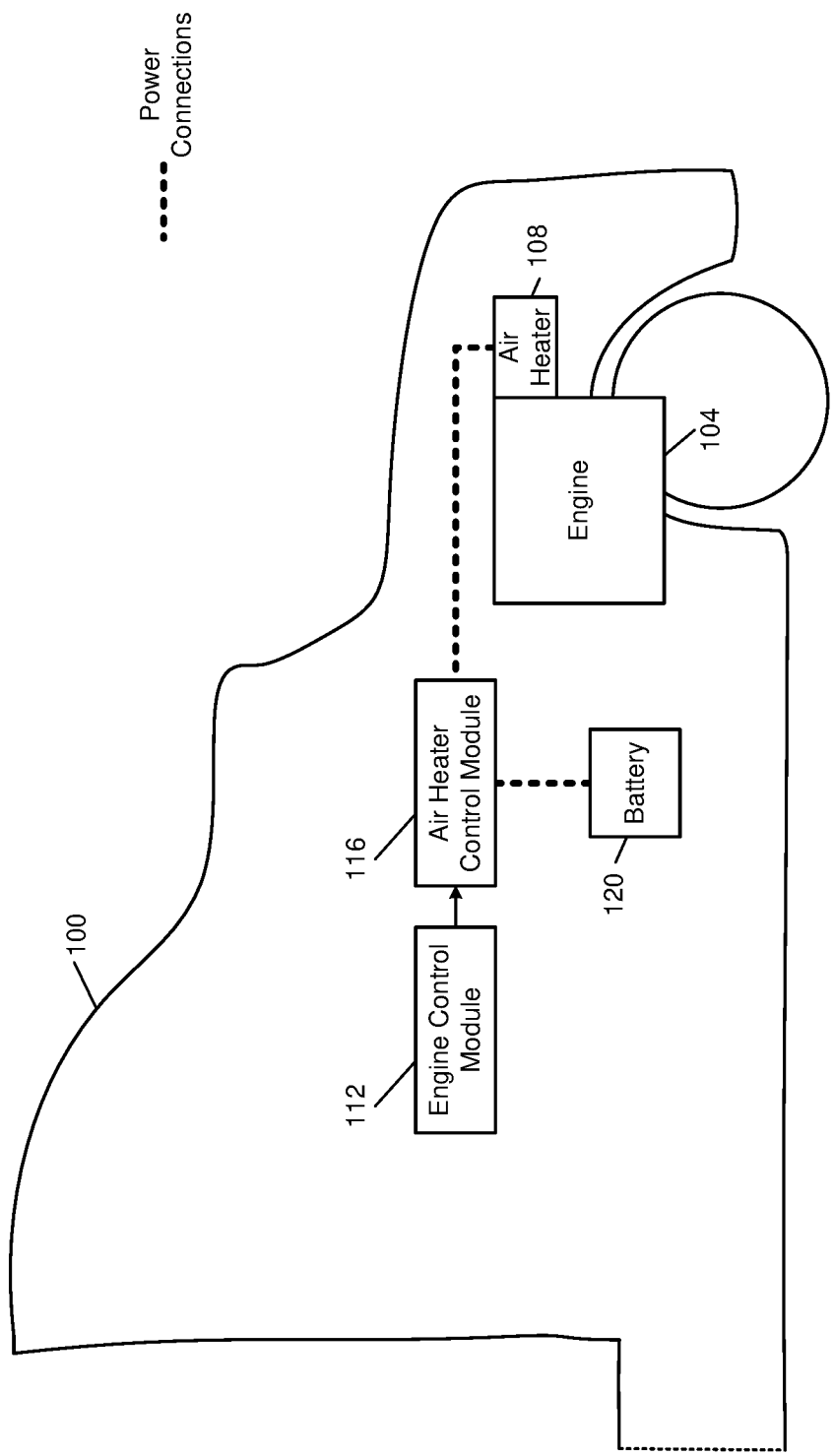
FIG. 1 is a functional block diagram of an engine with an intake air heating system.

A starter 224 selectively rotates the crankshaft of the engine 212 and is also powered by the battery 220. While different reference numerals are used, the air heater control module 204 may be configured for use with the engine control module 112 and the air heater 108 of FIG. 1.

As seen by the dashed line, the battery 220 provides power to the starter 224, to the engine control module 216, and to the air heater control module 204. The air heater control module 204 selectively applies power from the battery 220 to the air heater 208.

Solid lines show the ground connections of the battery to a frame 228 of the vehicle 200 as well as to the engine control module 216. In some vehicles, the engine 212 is grounded to the frame 228. This is simply one grounding configuration shown for example, and the present application are not limited to this configuration. The frame 228 serves as a ground potential.

Other components, such as the air heater 208, the starter 224, and an additional electrical device 232, may be grounded through the engine 212 (in particular, the engine block) to the frame 228. As a result, the effective ground voltage seen by the air heater 208 is based on the resistance of the ground path back to the battery 220 multiplied by the current following that same ground path. Generally, the starter 224 will not be running at the same time as the air heater 208. One or more other electrical features, such as the electrical device 232, may be operating at the same time as the air heater 208. The air heater control module 204 may apply power to the air heater 208 only during a predetermined period of operation of the engine 212 or continuously during operation of the engine 212.

Figure 3:
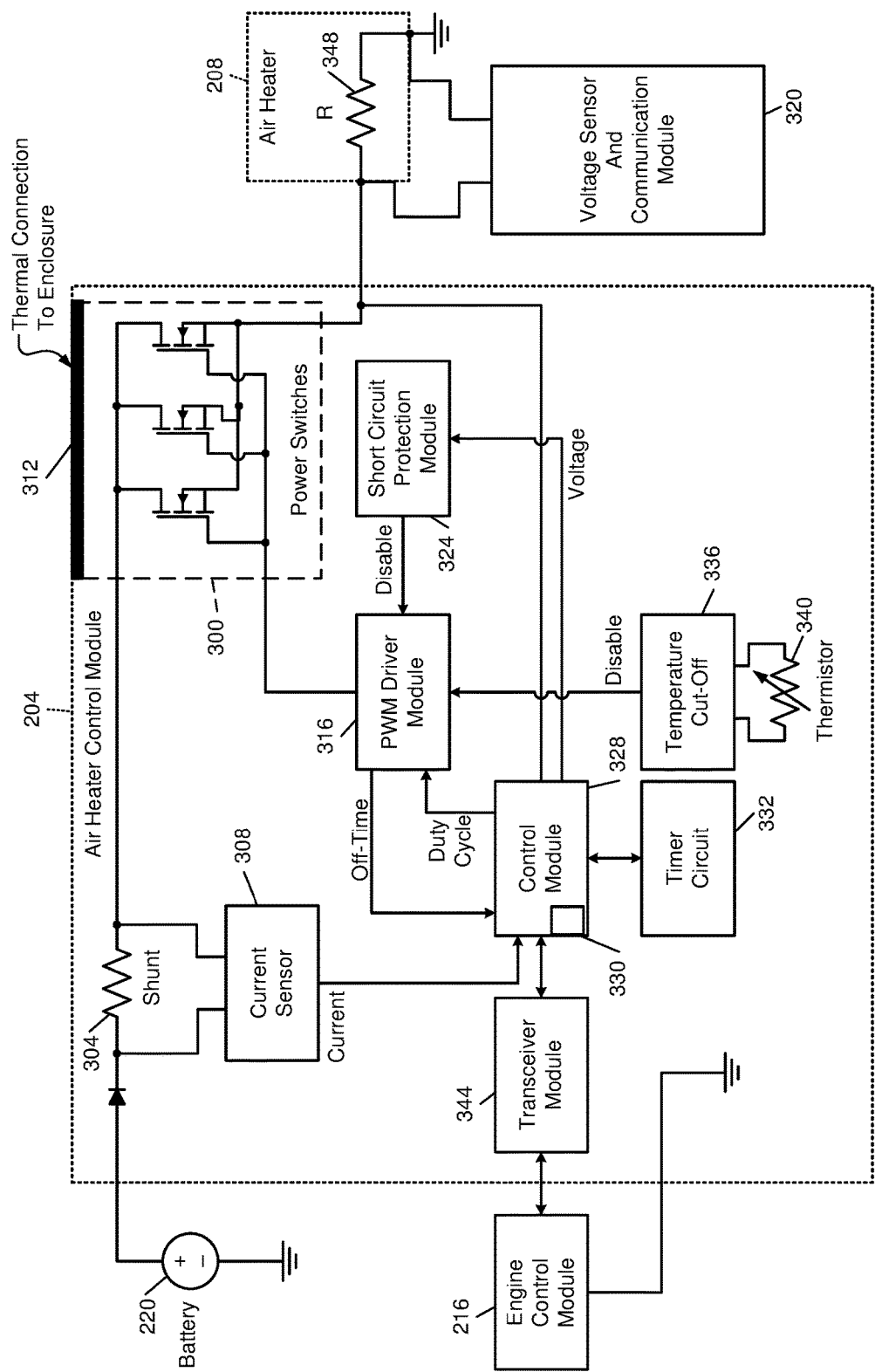
FIG. 3 is a functional block diagram of an example implementation of an air heater control module.

FIG. 3 includes a functional block diagram of an example implementation of the air heater control module 204. One or more power switches 300 selectively connect the battery 220 to the air heater 208. In various implementations, the air heater control module 204 may include a voltage converter that converts an output voltage of the battery 220 into a voltage to be applied to the air heater 208.

A shunt resistor 304 may be connected in series with the power switches 300, and a voltage across the shunt resistor 304 is measured by a current sensor 308. The current sensor 308 measures or determines the current through the power switches 300 and to the air heater 208 based on the voltage across the shunt resistor 304 and a predetermined resistance of the shunt resistor 304.

In the example of multiple power switches, the power switches 300 are electrically connected in parallel and may be controlled by the same gate signal. The power switches 300 may be included in a single package or in multiple packages that are thermally connected to a heat sink, such as an enclosure of the air heater control module 204. A thermal connection 312 is shown for illustration in FIG. 3 and may take the form of direct metal-to-metal contact or a thermal paste.

To protect against reverse battery connection, a diode may be connected in series with the power switches 300. The diode may be included to prevent backflow of current toward the battery 220. This diode may take the form of multiple diodes in parallel and each of the diodes may actually be an electrical switch configured to operate as a diode. For example, a set of electrical switches connected in parallel may be controlled to create an open circuit when voltages across the set of electrical switches indicate that current is flowing toward the battery 220.

The power switches 300 are driven by a pulse-width modulation (PWM) driver module 316. For example, during an initial power-up phase of the air heater 208, the PWM driver module 316 may set the duty cycle of the PWM to 100% so that the power switches 300 remain on constantly to provide power to the air heater 208. The PWM driver module 316 may control the power switches 300 to produce shaped pulses, such as to avoid producing excessive electrical emissions. For more information, see U.S. Pat. No. 7,472,695, issued Jan. 6, 2009, titled "Controller for Air Intake Heater," with first-named inventor Andrew Prust, the entire disclosure of which is incorporated by reference.

As discussed in more detail further below, a voltage monitor and communication module 320 measures the voltage across power terminals of the air heater 208. The voltage module and communication module 320 transmits the measured voltage back to the air heater control module 204 over the same cable used to power the air heater 208 using a power line communication (PLC) protocol. The voltage along with the current from the current sensor 308 can be used to determine the present (and exact) resistance of the air heater 208 regardless of the resistance of the output power cables and their connections, which may vary by cable length, cable temperature, connection tightness, integrity of cable lugs, etc. Since the heating element(s) of the air heater 208 are made of a metal with a known/predetermined resistance at a given temperature, the temperature of the heating element(s) can be determined by the air heater control module 204 at any time and under any condition from the resistance of the air heater 208 determined using the voltage measured and communicated by the voltage monitor and communication module 320. The voltage monitor and communication module 320 is a low cost circuit. Since the air heater control module 204 includes the current sensor 308, current sensing by the voltage monitor and communication module 320 is not needed. Also, since PLC is used, one or more additional communication wires or connections are not needed.

A short circuit protection module 324 outputs a disable signal to the PWM driver module 316 if the voltage measured by the voltage monitor and communication module 320 is too low (less than a predetermined voltage). If there is a short circuit or a partial short circuit in the air heater 208, the voltage measured by the voltage monitor and communication module 320 will be less than normal. For example, the expected voltage across the air heater 208 may be 10 or 11 volts and the predetermined voltage may therefore be set at 5 volts or another suitable voltage. The short circuit protection module 324 may operate in the analog domain (and be an analog circuit) and provide quicker response than a microprocessor, which may need to startup and execute boot code before assessing the voltage from the voltage monitor and communication module 320. The short circuit protection module 324 may also determine a short circuit by sensing excessive output current using the current sensor 308.

A control module 328 may be a programmable logic device, a microprocessor and memory, etc., receives the measured voltage and the measured current. The control module 328 includes a resistance module 330 that determines the present resistance of the air heater 208 based on the voltage and current, such as using one or more equations or lookup tables that relate voltages and currents to resistances. The control module 328 determines a commanded duty cycle based on the resistance of the air heater 208 and provides the commanded duty cycle to the PWM driver module 316. The PWM driver module 316 applies power to the power switch(es) 300 based on or at the commanded duty cycle.

The temperature of the air heater 208 corresponds to the resistance of the air heater 208. The temperature of the air heater 208 can be determined by the physical resistance to temperature property of the air heater material. The control module 328 may determine the temperature of the air heater 208 based on the resistance of the air heater 208. The control module 328 may set the commanded duty cycle based on adjusting the temperature of the air heater 208 toward or to a predetermined target temperature, such as a target temperature for combustion within the engine 212.

A timer module 332, which may be implemented within the control module 328, times various periods of interest to the control module 328. For example, one timer may measure the entire time that the air heater 208 has been heating up for the current use of the air heater 208. Another timer may track how frequently the ground voltage for the air heater 208 is checked. The present application, however, may eliminate the need for checking the ground voltage. Another timer may measure the period between resistance measurements.

A temperature cut-off module 336 supplies a disable signal to the PWM driver module 316 in response to a temperature of the air heater control module 204 being greater than a predetermined temperature. For example, a thermistor 340 may measure a temperature of an enclosure of the air heater control module 204, a package of one or more of the power switches 300, etc. Alternatively, the temperature of the air heater 208 may be determined (e.g., by the control module 328) based on the resistance of the air heater 208, such as using one of an equation and a lookup table that relates resistances to temperature.

The control module 328 receives a signal requesting intake air heating by the air heater 208 from the engine control module 216. For example, a single signal from the engine control module 216 to the control module 328 may be asserted to request intake air heating while a second signal between the engine control module 216 and the control module 328 may be used for the control module 328 to signal the presence of an error condition (e.g., in the air heater 208) to the engine control module 216.

In some implementations, the first signal provided to the control module 328 is binary, indicating either that intake air heating is requested or is not requested. In other implementations, the first signal may be modulated in either the analog or digital domains to indicate a degree of heating requested, such as a certain desired temperature of the air heater 208.

Similarly, the second signal returned to the engine control module 216 from the control module 328 may be a binary signal indicating either that there is no error or that there is an error. This return signal could also be modulated in the analog or digital domains to indicate the type of error or to indicate other conditions, such as the air heater 208 having reached a predetermined operating temperature. In some implementations, a transceiver module 344 allows the control module 328 to communicate with the engine control module 216 over a vehicle bus, such as a controller area network (CAN) bus or a Society of Automotive Engineers (SAE) J1939 standard bus.

In various implementations, components of the air heater control module 204, such as the control module 328, may be configured to turn off completely or enter a low-power state. For example, the transceiver module 344 may command the components of the air heater control module 204 to enter low-power states in response to having received no signals from the engine control module 216 for more than a predetermined period of time. The transceiver module 344 may wait for a predetermined wake-up signal or packet before returning the air heater control module 204 to full-power mode. When returning to full-power mode, the control module 328 may need to perform a startup routine prior to running the operational code that controls the PWM driver module 316.

In FIG. 3, while the intrinsic connection resistances are not shown, the resistance of the heating element(s) in the air heater 208 is (are) shown schematically as a resistor 348. The battery 220 may be characterized by an internal resistance (not shown), which may be one indication of the health of the battery 220. The control module 328 may measure a first voltage of the battery 220 with the power switches 300 off. For example, the control module 328 may receive a voltage value of one of the terminals of the shunt resistor 304 measured by the current sensor 308. The control module 328 can then turn on the power switches 300 and measure a second voltage of the battery 220 and the current through the shunt resistor 304. The internal resistance of the battery 220 can be calculated by the control module 328 based on or as the difference between the first and second voltages divided by the current.

Figure 4:
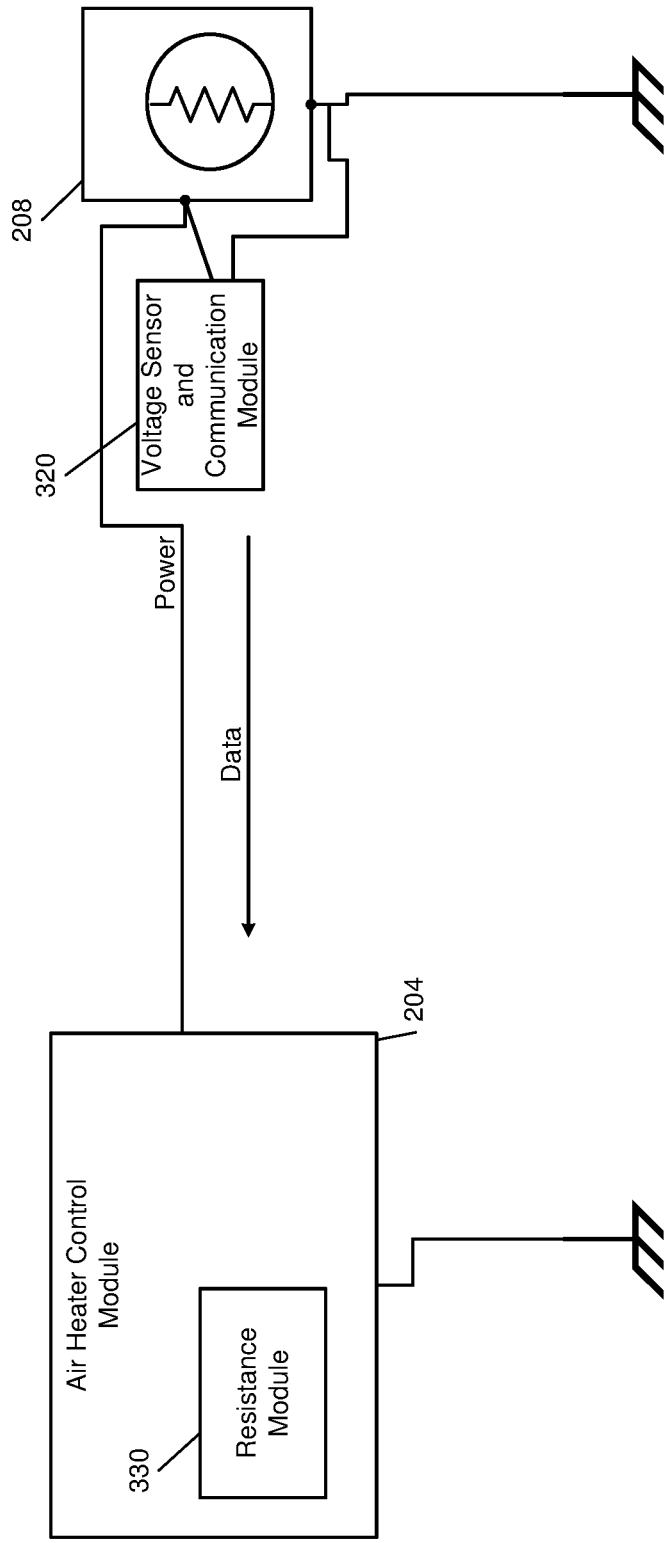
FIG. 4 is a functional block diagram of an example air heater control system.
Figure 5:
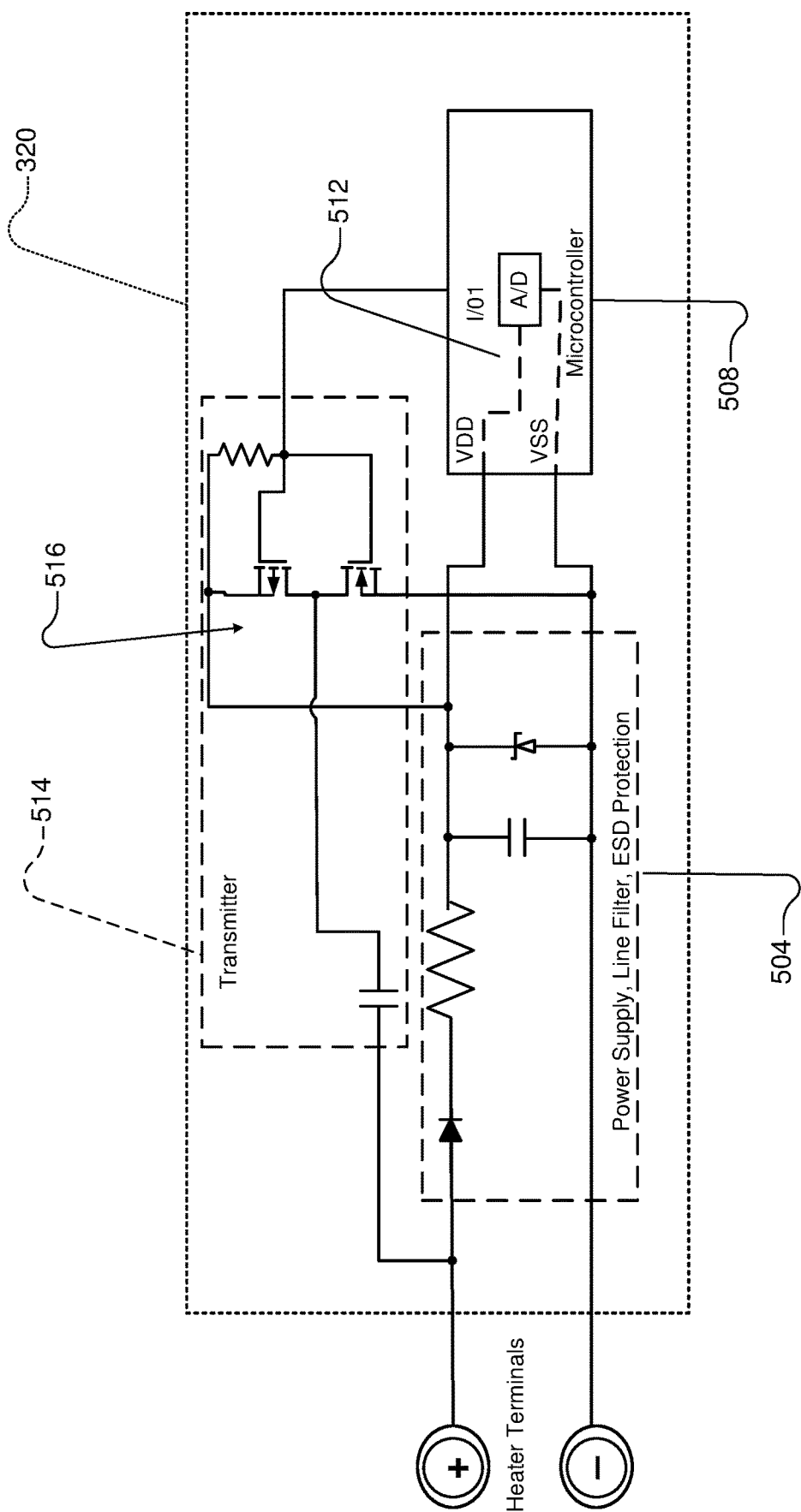
FIG. 5 is a schematic of an example implementation of a voltage sensor and communication module.

FIG. 4 is a functional block diagram of an example implementation of an air heater control system. FIG. 5 is a schematic of an example implementation of the voltage sensor and communication module 320.

As discussed above, the air heater control module 204 applies power to the air heater 208 (e.g., extracts power from), such as from the battery 220, via a power conductor (wire). The voltage sensor and communication module 320 is a two terminal device that extracts a small amount of power from the power conductor connected to a positive terminal of the air heater 208. The voltage sensor and communication module 320, like a negative terminal of the air heater 208 and the air heater control module 204 is connected to the ground potential, such as the frame 228. The negative terminal of the battery 220 is also connected to the ground potential.

The voltage sensor and communication module 320 is powered via the power conductor and is thus ON when the air heater 208 is ON and thus does not require (or include) any ON/OFF circuitry. Because it is a lower power device, the voltage sensor and communication module 320 does not significantly change the voltage of the air heater 208 or the current measured by the current sensor 308.

The voltage sensor and communication module 320 communicates the measured voltage across the positive and negative terminals of the air heater 208 to the air heater control module 204 on the power conductor using power line communication. The communication of the measured voltage has a low enough data bandwidth as to not cause radiated electromagnetic emissions at one or more predetermined frequencies or within one or more predetermined frequency ranges where other vehicle operations may be affected. The voltage sensor and communication module 320 may encode the measured voltage (e.g., for security) and transmit the encoding. The air heater control module 204 performs decoding in this example to recover the measured voltage. In various implementations, the voltage sensor and communication module 320 may include error correction with the measured voltage (or the encoding), and the air heater control module 204 may perform error detection to ensure proper transmission of the measured voltage. The communicated voltage (or encoding) is superimposed on the power conductor on top of the voltage output from the air heater control module 204.

As shown in FIG. 5, voltage sensor and communication module 320 may include one or more filters and/or one or more electrostatic discharge (ESD) protection devices, generally illustrated by 504. The voltage measurement across the positive and negative terminals of the air heater 208 may be performed by a microcontroller 508 or another suitable type of device. An analog to digital (A/D) converter 512 may be used to sample the voltage and convert the voltage into a digital value corresponding to the voltage.

A transmitter module 514 includes switches 516 that are switched to communicate the measured voltage on the power conductor. The microcontroller 508 may control switching of the switches to communicate the measured voltage. The switches 516 may include opposite types (e.g., one N-type and one P-type) so a single gate signal can be applied to both of the switches 516. A node between the switches 516 may be connected to the power conductor for communication of the measured voltage via the power conductor. The node is capacitively and/or inductively connected to the power conductor.

The voltage sensor and communication module 320 measuring the voltage across the positive and negative terminals of the air heater 208 provides a more accurate measurement of the voltage and therefore a more accurate determination of the resistance of the air heater 208. Measurement of the voltage at the output of the air heater control module 204 may be less accurate as the resistance of the cabling and other connection components may vary or drift over time and temperature and with the (e.g., relatively high, such as greater than 200 Amps) current applied to the air heater 208. The voltage sensor and communication module 320 eliminates measurement errors that occur from the resistance of the power cabling varying (which may vary with temperature and/or other connection issues) thereby enabling temperature or resistance (sub Ohm) of the air heater 208 to be accurately determined. No additional wires and connectors are added, which can be expensive, decrease reliability, take space, and create clutter.

Figure 6:
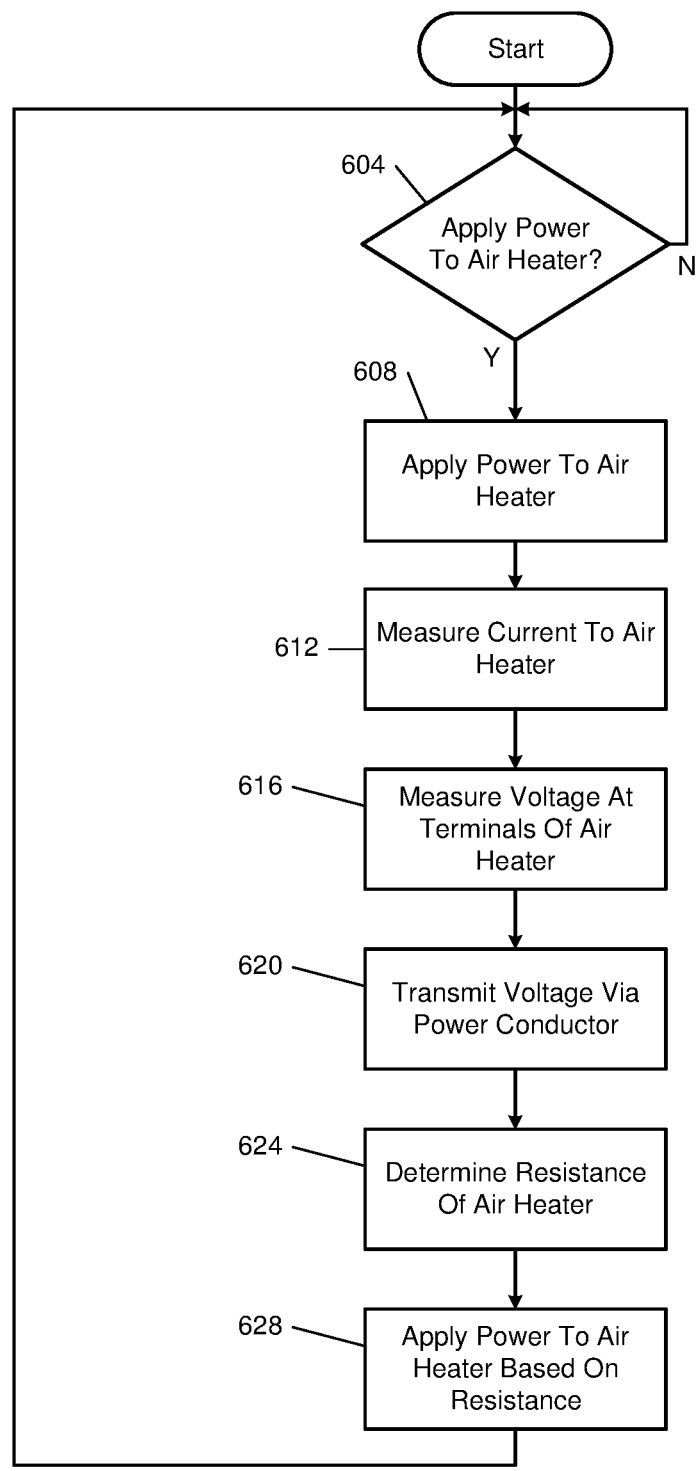
FIG. 6 is a flowchart depicting an example method of controlling application of power to an air heater of an engine of a vehicle.

FIG. 6 is a flowchart depicting an example method of controlling power to the air heater 208. Control begins with 604 where the control module 328 determines whether to power the air heater 208. The control module 328 may apply power to the air heater 208 continuously while the engine 212 is running or, for example, in response to a request from the engine control module 216. If 604 is true, control continues with 608. If 604 is false, control may return to 604.

At 608, the control module 328 (via the PWM driver module 316) begins applying power to the air heater 208 via the power conductor and closing one or more of the switches 300. The control module 328 may apply predetermined power to the air heater 208 initially.

At 612, the current sensor 308 measures current to the air heater 208. At 616, the voltage sensor and communication module 320 measures the voltage across the positive and negative terminals of the air heater 208. At 620, the voltage and communication module 320 communicates the measured voltage to the air heater control module 204 via the power conductor used to apply power to the air heater 208.

The voltage sensor and communication module 320 transmits the measured voltage using power line communication.

At 624, the resistance module 330 determines the resistance of the air heater 208 based on the measured current and the measured voltage, such as using an equation or a lookup table that relates currents and voltages to resistance (e.g., R=V/I, where R is the resistance, V is the measured voltage, and I is the measured current). At 628, the control module 328 (via the PWM driver module 316) applies power to the air heater 208 based on the resistance of the air heater 208. For example, the control module 328 may adjust the duty cycle applied to one or more of the switches 300 to adjust the resistance of the air heater 208 to within a predetermined resistance range or to a predetermined resistance. The predetermined resistance range or the resistance may be fixed or variable, such as variable based on one or more operating parameters. Control returns to 604.

In various implementations, the control module 328 may determine the temperature of the air heater 208 based on the resistance of the air heater 208, such as using an equation or a lookup table that relates resistances to temperature. The control module 328 (via the PWM driver module 316) applies power to the air heater 208 based on the temperature of the air heater 208 determined based on the resistance. For example, the control module 328 may adjust the duty cycle applied to one or more of the switches 300 to adjust the temperature of the air heater 208 to within a predetermined temperature range or to a predetermined temperature. The predetermined temperature range or the predetermined temperature may be fixed or variable, such as variable based on one or more operating parameters.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. An intake air heating system for a vehicle, the system comprising:
    an air heater configured to heat air in an intake system of an engine;
    an air heater control module configured to selectively apply power to the air heater via a power conductor; and
    a voltage sensor and communication module configured to:
        measure a voltage on terminals of the air heater; and
        transmit an indicator of the voltage to the air heater control module on the power conductor,
    wherein the air heater control module is further configured to:
        receive the indicator via the power conductor;
        determine a resistance of the air heater based on the voltage on the terminals of the air heater and a current through the air heater; and
        apply power to the air heater based on the resistance of the air heater.

2. The system of claim 1 wherein the air heater control module is configured to determine the resistance of the air heater using one of an equation and a lookup table, the one of the equation and the lookup table relating currents and voltages to resistances.

3. The system of claim 1 wherein the voltage sensor and communication module is configured to transmit the indicator of the voltage on the power conductor using a power line communication protocol.

4. The system of claim 1 wherein the voltage sensor and communication module includes a microprocessor that is powered via the power conductor.

5. The system of claim 1 wherein the voltage sensor and communication module is configured to set the indicator by encoding a digital value corresponding to the voltage.

6. The system of claim 5 wherein the air heater control module is further configured to determine the voltage on the terminals of the air heater by decoding the indicator.

7. The system of claim 1 wherein the voltage sensor and communication module is further configured to transmit an error correction parameter with the indicator to the air heater control module via the power conductor.

8. The system of claim 7 wherein the air heater control module is further configured to verify correctness of the indicator based on the error correction parameter.

9. The system of claim 1 wherein the air heater control module is configured to control the application of power to the air heater based on adjusting the resistance of the air heater within a predetermined resistance range.

10. The system of claim 1 wherein the air heater control module is configured to apply power to the air heater using pulse width modulation (PWM) control and to determine a duty cycle for the PWM control based on the resistance.

11. The system of claim 1 wherein the air heater control module is further configured to:
    determine a temperature of the air heater based on the resistance; and
    apply power to the air heater based on the temperature of the air heater.

12. The system of claim 1 wherein the air heater control module is configured to measure the current through the air heater.

13. An intake air heating method for a vehicle, the method comprising:
    selectively applying power to an air heater via a power conductor, the air heater configured to heat air in an intake system of an engine when powered;
    measuring a voltage on terminals of the air heater; and
    transmitting an indicator of the voltage on the power conductor;
    receiving the indicator via the power conductor;
    determining a resistance of the air heater based on the voltage on the terminals of the air heater and a current through the air heater; and
    applying power to the air heater based on the resistance of the air heater.

14. The method of claim 13 wherein determining the resistance includes determining the resistance of the air heater using one of an equation and a lookup table, the one of the equation and the lookup table relating currents and voltages to resistances.

15. The method of claim 13 wherein transmitting the indicator includes transmitting the indicator of the voltage on the power conductor using a power line communication protocol.

16. The method of claim 13 wherein transmitting the indicator includes transmitting the indicator by a voltage sensor and communication module that includes a microprocessor that is powered via the power conductor.

17. The method of claim 13 further comprising setting the indicator by encoding a digital value corresponding to the voltage.

18. The method of claim 17 further comprising determining the voltage on the terminals of the air heater by decoding the indicator.

19. The method of claim 13 further comprising transmitting an error correction parameter with the indicator via the power conductor.

20. The method of claim 19 further comprising verifying correctness of the indicator based on the error correction parameter.

* * * * *